Sept. 2, 1969 A. C. BRADHAM III 3,464,769

CIRCUIT BOARD AND METHOD OF MANUFACTURE

Filed Dec. 5, 1966 3 Sheets-Sheet 1

Allen C. Bradham III,
Inventor.

Koenig, Senniger, Powers and Leavitt,
Attorneys.

CIRCUIT BOARD AND METHOD OF MANUFACTURE

United States Patent Office 3,464,769
Patented Sept. 2, 1969

3,464,769
CIRCUIT BOARD AND METHOD OF MANUFACTURE

Allen C. Bradham III, Menomonee Falls, Wis., assignor to Texas Instruments Incorporated, Dallas, Tex., a corporation of Delaware Filed Dec. 5, 1966, Ser. No. 599,114
Int. Cl. G03b 27/10
U.S. Cl. 355—84 3 Claims

ABSTRACT OF THE DISCLOSURE

A master circuit board is prepared, comprising an insulating layer on opposite sides of which are attached conductive grids which are staggered relative to one another in one direction across the plane of the layer. These grids present openings on opposite sides of the layer. In the layer are zigzag conductive ribbons which expose lines of conductive areas on opposite faces of the layer in said openings. These areas, with portions of the grids, form pockets for containment of meltable conductive slugs. Exposed conductive surfaces are covered with photosensitive material. To convert a master board into a circuit board, there is provided scanning means in the form of a laser beam which is under control of programming tape or the like for scanning and intensity of excitation. The beam while scanning is excited to one degree for intermittently exposing photosensitive material on a grid which is subsequently developed and the grid etched to form desired circuitry. The beam is excited intermittently to another degree to melt the slugs and form interconnections between the grids and the ribbons.

BACKGROUND OF THE INVENTION

Prior master circuit boards require a large amount of special art work for etching to provide patterns for establishing circuitry. In the case of two-sided, etched printed circuit boards, a problem of considerable magnitude arises when interconnections are to be made between the conductive layers on the two sides. This is generally done with feed-through connections in the form of plated holes between the circuit layers. This requires precise orientation of points on the layers at which drilling is to be done. The necessary art work, etching, drilling and plating are both complex and time-consuming. According to the invention, art work is eliminated. Information for determining circuit patterns and interconnections is computer-generated and stored on magnetic tape for rapid transfer through scanning means to effect operations on the board. A single etch step for a given side of a board generates all circuit traces on that side, making the running of connections. This, and the scanning operation, result in a fast, accurate and reliable manufacturing method of making superior boards.

SUMMARY

The invention comprises making up master boards, each having an insulating layer, spaced ribbons therein of conductive material of zigzag form, each extending in one direction across the board and exposing spaced and aligned areas thereof in staggered positions on two sides of the layer, with pockets of insulation adjacent said exposed areas. In the pockets are slugs of conductive material. On opposite sides of the insulating layer are conductive grids to locate lines of conductive material between the exposed areas of the ribbons and crossing the slugs. Exposed surfaces of the grids and ribbon are covered by photosensitive material. A master board as above made is scanned by a variably excited laser beam for exposing the photosensitive material on the grids for later development into circuitry. The beam also melts the slugs to form interconnections between the circuitry formed by the grids. Excitation of the beam is programmed by suitable means such as magnetic tape on which is computer-generated information for obtaining the desired circuits.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
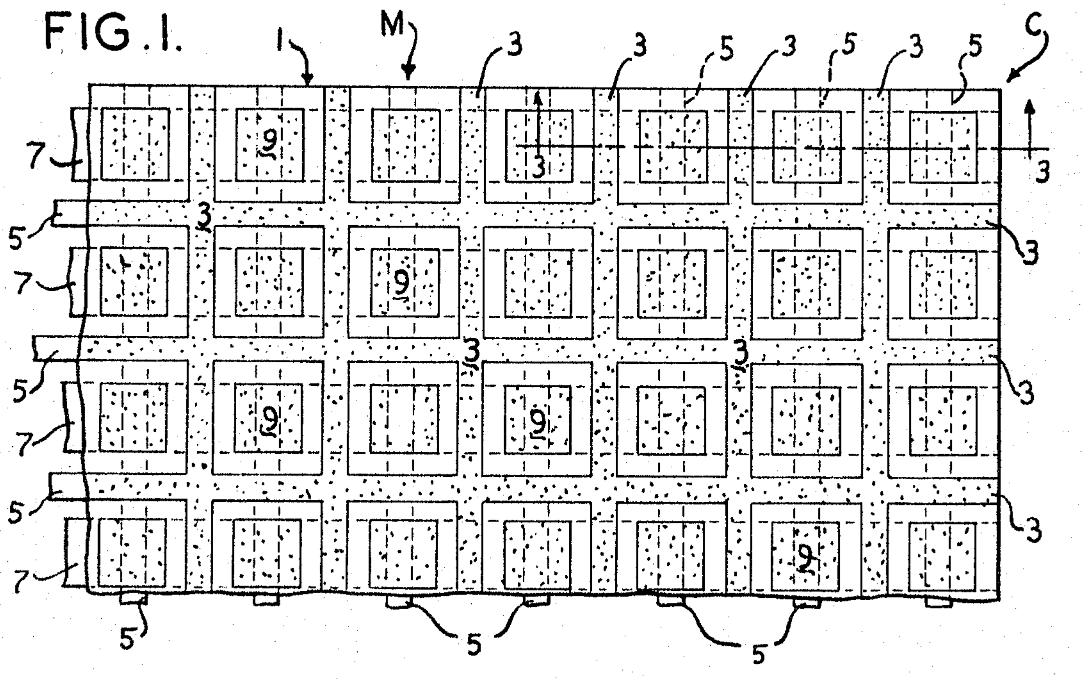
FIGURE 1 is a plan view of an upper right-hand corner portion C of a master board made according to the invention.
Figure 2:
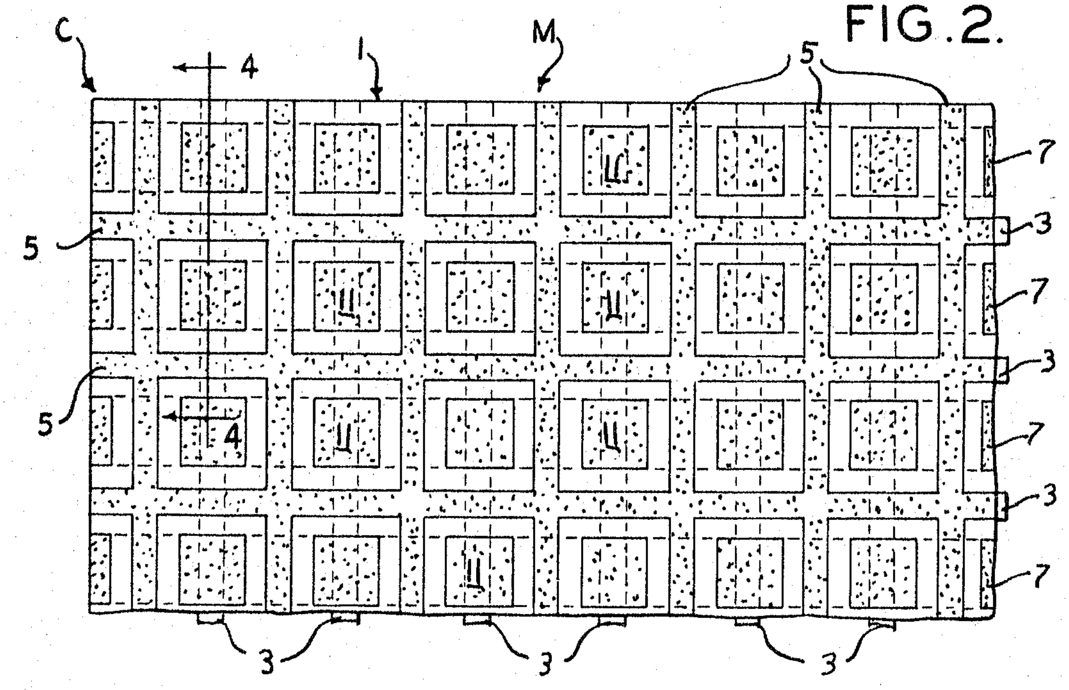
FIGURE 2 is a plan view of the other side of the same board, turned end-for-end from right to left from the FIGURE 1 position so that said corner portion C appears at the upper left.
Figure 3:
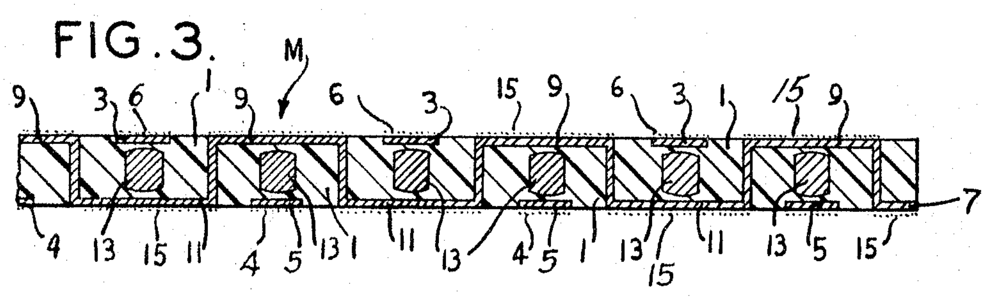
FIGURE 3 is an enlarged cross section taken on line 3—3 of FIGURE 1.

Referring to FIGURES 1–3, a board is shown in general at M. This comprises a layer 1 of a conventional plastic insulating material such as glass fibre or other fibre-filled epoxy resin or the like. This material provides a supporting insulating matrix for several conductive foils as follows: At 7 are shown zigzag ribbons of foil which extend horizontally across the insulating sheet from one edge to the other. They produce exposed square portions 9 on one side of the board (FIGURES 1 and 3) and exposed square portions 11 on the other side of the board (FIGURES 2 and 3). These exposed squares are coated with a photosensitive layer illustrated by dots 15 (FIGURE 3). On one side of the insulating material sheet 1 (FIGURE 1) is a thin conductive squared grid 3 (FIGURE 1). This is composed of a foil of metal such as copper suitably adhered to one face of the layer 1. It may be prepared by plating and photoetching, or by prepunching and adhesive attachment. This grid 3 has its exposed face coated with a layer of photosensitive material, illustrated by dots 6 (FIGURE 3). On the other side of the layer 1 (FIGURE 2) is a similar conductive squared grid 5, coated with a layer of photosensitive material illustrated by dots 4 (FIGURE 3).

The grids 3 and 5 exposed on opposite sides of the layer 1 are transversely staggered in one direction crosswise of the board. The grids 3 and 5 are not staggered perpendicularly to the general horizontal direction of the ribbons 7. Therefore, the grids have conductive lines or bands of material which extend crosswise of the ribbons and also have bands of material which extend parallel to and between the ribbons 7. The latter on opposite sides of the sheet 1 are in register. Thus under each exposed portion 9 there lies on the opposite side of the board a portion of the grid 5, and above each exposed portion 11 on the other side of the board lies a portion of the grid 3, as best shown in FIGURES 3 and 4.

At numerals 13 are shown slugs of conductive weldable or solderable material. For example, these may be composed of a conventional fluxed solder. One group of these slugs lies in the pockets of insulation between 5 and 9, and another lies in the pockets of insulation between 3 and 11. The ends of the slugs 13 are rounded, so as to provide above and below them thin regions of the insulating layer 1. By a heating process to be described below, any slug 13 may be melted, along with adjacent conductive parts 3, 11 or 5, 9, as the case may be, thereby forming a conductive cross connection or junction between grid 3 and a ribbon 7 or grid 5 and a ribbon 7, as the case may be (see FIGURE 6 for an example of the former). Such connections take the place of connections which were formerly made by drilling holes and plating through them.

A master board is one in the condition shown in FIGURES 1–4 which may be made up in quantities and stored, ready for conversion into operating circuit boards. Such conversion will now be described by reference to FIGURES 5–7.

Figures 4, 7:
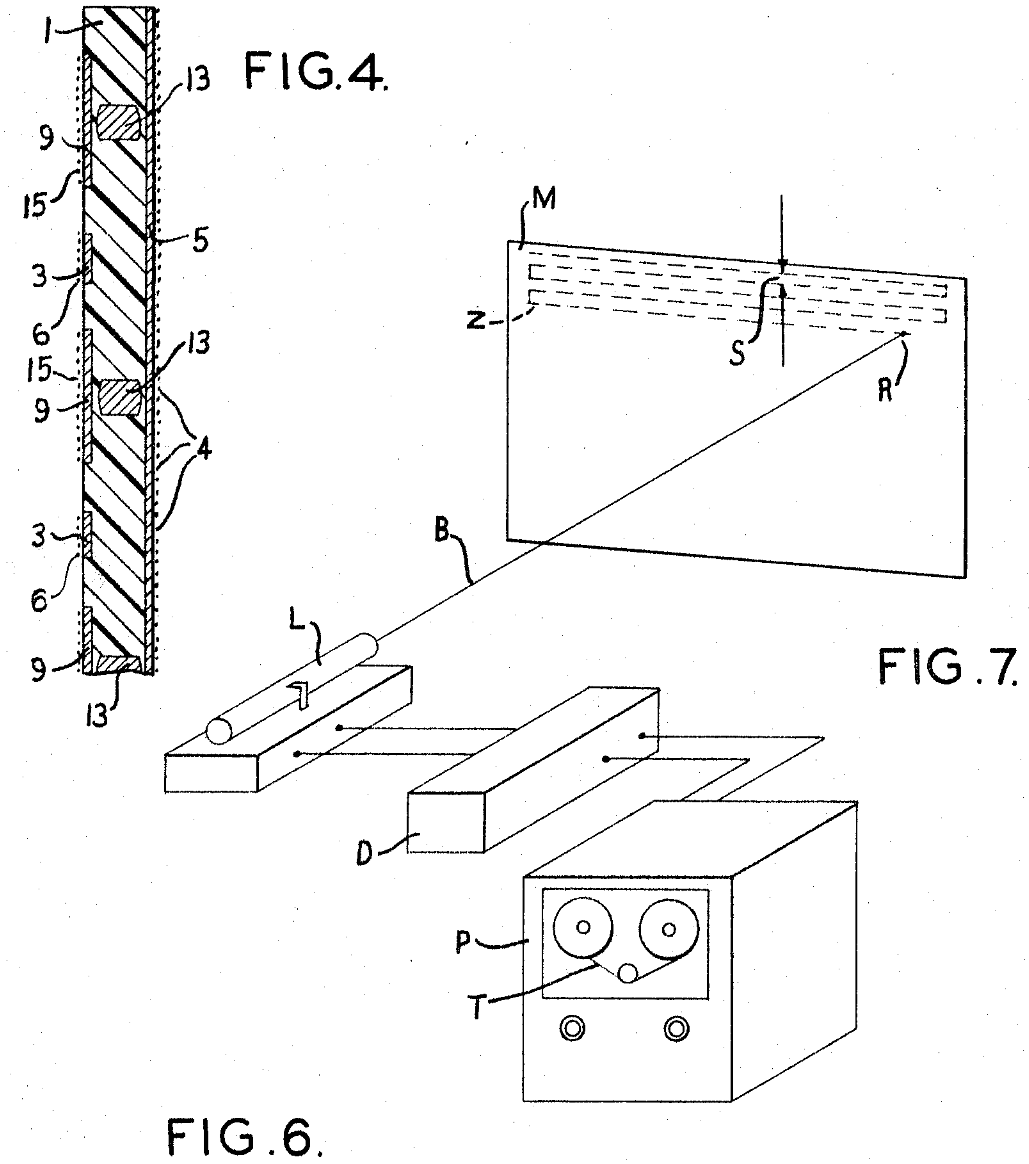
FIGURE 4 is an enlarged cross section taken on line 4—4 of FIGURE 2.
FIGURE 7 is a schematic view of scanning means employed for converting master boards such as shown in FIGURES 1–3 into operating circuit board such as shown in FIGURES 4 and 5.

A master board M is mounted as shown in FIGURE 7 to be impinged upon by a scanning beam B of a scanning laser gun L. At D is shown a deflection controller and beam modulator for the laser gun L. At P is shown a programmer for the deflection controller and modulator D. This is under control of magnetic programming tape T. The tape T provides information by means of which the beam B is deflected to sweep back and forth across a face of the board M, as indicated at Z.

In FIGURE 7, due to its small size, the grids 3, 5 and ribbons 7 are not shown. It will be understood, however, that the spacing between traverses is such as shown at S on FIGURES 5 and 7. A complete scan takes only a few microseconds, during which the trace R of beam B on board M runs horizontally through the centers of the horizontal rows of exposed squares of ribbons 7 and over the horizontal lines of the exposed grid (as, for example, grid 3). After one side of a board has been scanned and processed as appears below, it is turned over and the other side likewise scanned. During each scanning operation the intensity level of the beam B is varied in accordance with the program carried by the tape T. The variation is according to three categories, which may be referred to as "nonexposure," "exposure" and "heating." Nonexposure means that the beam is deexcited. Exposure means that it is excited sufficiently to expose a film of photosensitive material so that it may later be developed to form an etch protective layer where exposed and developed and washed away where unexposed for subsequent etching to separate sections of the grids. For example, on FIGURE 5 the open spaces 19 show separations thus made in grid 3. Like separations may be made in grid 5. Heating means that the beam is sufficiently excited to heat a slug 13 so that it melts to form an electrical cross connection between one or the other of the grids 3 and 5 and a ribbon 7. Preferably the melting temperature of a slug 13 is below that of the overlying foil material so that the latter is not melted in the cross-connecting process. For example, on FIGURE 5 dotted circles indicate where soldered cross connections 21 have under heating by beam B been made between portions of the grid 3 and certain of the ribbons 7. It will be understood that like cross connections may be made between the grid 5 on the other side of the master board M and certain of the ribbons 7.

Figure 5:
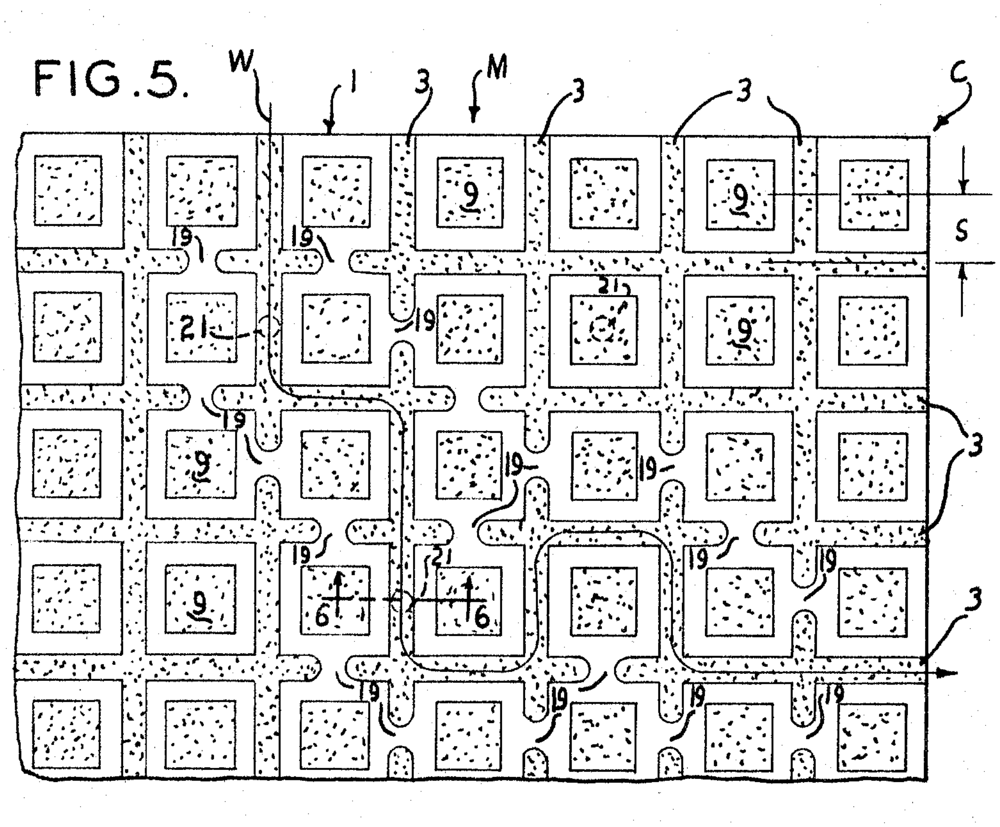
FIGURE 5 is a view similar to FIGURE 1, showing an example of how a master board is converted into an operating circuit board.

Scanning may be accomplished in two passes for each side of each board M. For example, the tape T may be programmed so that on the first complete pass over the master board the beam B is excited for exposure of the photosensitive layer 15 on the exposed grid 3 or 5 except at points 19, at which points the beam is temporarily deexcited for nonexposure. Then the board M is placed in the conventional developer, washed and etched. The etching removes materials only from the grid 3 or 5 at points 19, the remainder having been protected against etching by the protective layer of exposed and developed photographic film. A number of separations 19 in grid 3 are illustrated in FIGURE 5, designed to effect a current path such as shown by the serpentine dart W. This is only one of a number of paths that may be effected by establishing other separations or cuts 19 (not shown).

Figure 6:
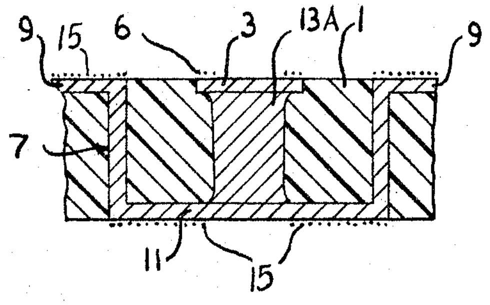
FIGURE 6 is an enlarged cross section taken on line 6—6 of FIGURE 5.

Next the board is again set up to be scanned by the beam B from an additional record on the same tape T or on another tape. Alternatively, it might be placed in another available scanning unit like the one shown in FIGURE 7. In this case the beam B is maintained in deexcited condition until points are reached such as shown by the dotted circles 21 on FIGURE 5. At these points the beam is excited to a heating condition for soldering or welding, which melts a slug 13 to join grids 3 and 5 to a ribbon 7, making a cross connection 13A such as shown in FIGURE 6. The above process finishes one side of the board. Next the board is turned over and the process above described for a first pass is repeated according to whatever program program is desired to outline the circuits on and finish the other side of the board. It will be understood that many more paths analagous to W may be established through the grids 3 or 5 on the sides of the board, as well as many more interconnections such as shown at 21 between the grids 3 and 5 and the zigzag ribbons 7.

In view of the above, it will be seen that the several objects of the invention are achieved and other advantageous results attained.

As various changes could be made in the above products and methods without departing from the scope of the invention, it is intended that all matter contained in the above description as shown in the accompanying drawings shall be interpreted as illustrative and not in a limiting sense.

I claim:

1. The method of exposing layers of conductive material having photosensitive coatings and located on opposite sides of a circuit board, said board carrying meltable means for making interconnections between said conductive layers; comprising successively projecting onto the coatings on opposite sides of the board a laser beam from a laser gun, controlling the gun to deflect the beam to scan the board on each side, intermittently exciting the beam while scanning to a level sufficient to selectively photographically develop portions of said photosensitive coatings, and intermittently exciting the scanning beam to another and higher level sufficient to melt said meltable means to form interconnections between the conductive materials on the opposite sides of the board.

2. The method of forming circuitry on a master circuit board having an insulating layer with spaced lengths of conductive material of zigzag form extending in one general direction through the layer and exposing spaced but aligned areas thereof in staggered positions on opposite sides of said layer with pockets of insulation behind said exposed areas containing slugs of meltable conductive material, said board also having a grid attached to at least one side of the insulating layer and formed of transversely disposed lines of conductive material, the grid being positioned relative to said ribbons to locate lines of conductive material between said exposed areas of the ribbons and tranverse lines of conductive material crossing at least some of said slugs, the exposed surfaces of the grid and of said area carrying a coating of photosensitive etch-resist material, comprising scanning at least one grid on one side of the board with a variably excited laser beam, the excitation of which is programmed for one intermittent value of excitation to affect said resist material for removal by etching of those portions of the grid which are at desired points of segmentation and programmed for other intermittent excitation of the beam to effect bonding by heating of some of the slugs to the grid and to at least some of the ribbons.

3. The method of forming circuitry on a master circuit board having an insulating layer with spaced lengths of conductive material of zigzag form extending in one general direction through the layer and exposing spaced but aligned areas thereof in staggered positions on opposite sides of said layer with pockets of insulation behind said exposed areas containing slugs of meltable conductive material, said board also having a grid attached to each side of the insulating layer and formed of transversely disposed lines of conductive material, the grids being positioned relative to said ribbons to locate lines of conductive material betwen said exposed areas of the ribbons and transverse lines of conductive material crossing at least some of said slugs, the exposed surface of the grid and of said areas carrying a coating of photosensitive etch-resist material, comprising scanning each grid with a variably excited laser beam, the excitation of which is programmed for one intermittent value of excitation to affect said resist material for removal by etching of those portions of the grid which are at desired points of segmentation and programmed for other intermittent excitation of the beam to affect bonding by heating of some of the slugs to at least one grid and at least one ribbon.

References Cited

UNITED STATES PATENTS

| | | | |
|---|---|---|---|
| 3,000,286 | 9/1961 | Elphick | 95—73 |
| 3,220,013 | 11/1965 | Harris | 346—107 |
| 3,266,393 | 8/1966 | Chitayat | 95—1.1 |
| 3,267,454 | 8/1966 | Schaaf | 340—324 |
| 3,267,555 | 8/1966 | Berger | 95—1.7 X |

JOHN M. HORAN, Primary Examiner